United States Patent [19]

Muoi

[11] 4,415,803
[45] Nov. 15, 1983

[54] OPTICAL RECEIVER WITH IMPROVED DYNAMIC RANGE

[75] Inventor: Tran V. Muoi, Ocean, N.J.

[73] Assignee: Bell Telephone Laboratories, Incorporated, Murray Hill, N.J.

[21] Appl. No.: 442,570

[22] Filed: Nov. 18, 1982

Related U.S. Application Data

[63] Continuation of Ser. No. 199,558, Oct. 22, 1980, abandoned.

[51] Int. Cl.³ ............................................. H01J 40/14
[52] U.S. Cl. ........................ 250/214 A; 250/214 AG; 330/284; 455/619
[58] Field of Search ....... 250/214 R, 214 A, 214 AG; 455/600, 602, 608, 617, 619; 330/284

[56] References Cited

U.S. PATENT DOCUMENTS

| | | |
|---|---|---|
| 3,027,518 | 3/1962 | Ketchledge . |
| 3,169,229 | 2/1965 | Ulzurrun . |
| 3,743,837 | 7/1973 | Pooley et al. ............... 250/214 AG |
| 4,115,741 | 9/1978 | Skutta ................................. 330/284 |
| 4,178,482 | 12/1979 | Ouellette ........................ 330/284 X |
| 4,241,455 | 12/1980 | Eibner ................................ 455/600 |
| 4,257,125 | 3/1981 | Theall, Jr. ........................... 455/608 |

OTHER PUBLICATIONS

Mayes, "Audio Compressor," Wireless World; Jul. 1978; vol. 84, No. 1511; p. 74.
Davis et al., "Registration Automatic Gain Circuits;" Oct. 1974; vol. 17, No. 5, IBM Technical Disc. Bulletin, pp. 1363-1364.
Hullett et al., "A Feedback Receive Amplifier for Optical Transmission Systems;" IEEE Trans. on Comm. COM-24, No. 10, pp. 1180-1185; Oct. 1976.
Maione et al., "Practical 45-Mb/s Regenerator for Lightwave Transmission;" Bell System Technical Journal, vol. 57, No. 6; pp. 1837-1856; Jul.-Aug. 1978.
Heckt, "Automatic Gain Control Has 60-Decibel Range," Electronics, vol. 50, No. 7, Mar. 31, 1977; p. 107.
Graeme, "Feedback Lowers AGC Distortion," Design Ideas, vol. 26, No. 1, Jan. 7, 1981; p. 202.

Primary Examiner—David C. Nelms
Assistant Examiner—Edward P. Westin
Attorney, Agent, or Firm—David R. Padnes

[57] ABSTRACT

An optical receiver having enhanced dynamic range is achieved through the use of a variable impedance shunt 203 disposed at the receiver input. The optical receiver comprises an optical detector 102 serially connected to a transimpedance amplifier 201. The optical detector 102 receives an optical signal having a variable optical power level and modulation bandwidth and generates a corresponding electrical current therefrom. The transimpedance amplifier provides a fixed amount of gain and converts the electrical current to an output voltage. An automatic gain control circuit 202 produces a control signal which varies in response to the amplitude of the output voltage. The control signal is applied to the variable impedance device to vary the impedance therein. This maintains the output voltage at a predetermined amplitude over the modulation bandwidth without any significant reduction in receiver sensitivity.

6 Claims, 3 Drawing Figures

OPTICAL RECEIVER WITH IMPROVED DYNAMIC RANGE

This is a continuation of application Ser. No. 199,558 filed Oct. 22, 1980, now abandoned.

TECHNICAL FIELD

The present invention relates to optical transmission systems and, more particularly, to an optical receiver with improved dynamic range.

BACKGROUND OF THE INVENTION

An optical receiver detects an optical signal and generates an electrical output signal therefrom having a predetermined amplitude.

The optical signal has a fixed wavelength that is generated by an optical source, such as a laser or light emitting diode (LED). Information is transmitted on the optical signal by modulating the intensity of the optical signal in a detectable way. To transmit large amounts of information per unit time, the optical signal is modulated at a high rate. The higher the modulation rate, the greater the modulation bandwidth of the transmitted optical signal. In designing an optical transmission system, the system components, e.g., regenerators and receivers, must be capable of providing an electrical output signal having a predetermined amplitude over the modulation bandwidth. In addition, an optical receiver in telecommunications applications must provide the electrical output signal with low noise and distortion for a wide range of incoming optical power levels. This additional requirement is reflected in two circuit parameters of optical receivers: dynamic range and sensitivity. Dynamic range is the range of optical signals, i.e., the difference between the maximum optical power level before overloading and the minimum optical power, over which an optical receiver can provide the desired electrical output signal with an acceptable error rate. Sensitivity, on the other hand, is a function of signal to noise ratio and only indicates the above-defined minimum optical power level.

The prior art approach to designing an optical receiver is to serially connect an optical detector to the input of a low-noise, fixed gain amplifier. An automatic gain circuit (AGC) is then coupled to the output of the low-noise amplifier to maintain the receiver output at the desired amplitude. While this approach works satisfactorily, the resulting optical receiver often has insufficient dynamic range. In telecommunications applications, for example, the range of optical power levels causes overloading of the AGC circuit resulting in a distorted receiver output signal. In optical telecommunications systems wherein the wavelength of the optical source is less than 1 micron ($\mu$m), hereinafter referred to as "short" wavelength systems, the problem of overloading has been solved through the use of an AGC loop to control the gain of the optical detector. (See, for example, a publication by T. L. Maione et al entitled "Atlanta Fiber System Experiment: Practical 45-Mbs Regenerator for Lightwave Transmission," Bell System Technical Journal, Vol. 57, No. 6, July-August 1978, pages 1837-1856). This technique, however, cannot be applied to systems wherein the wavelength of the optical source is greater than 1 micron, hereinafter referred to as "long" wavelength systems, since the applicable detectors have unity gain. The problem of insufficient dynamic range in receivers for "long" wavelength systems is, therefore, as yet unresolved. Moreover, the solution to this problem is of significant import since "long" wavelength systems exhibit lower signal losses per unit distance than comparable "short" wavelength optical transmission systems.

SUMMARY OF THE INVENTION

In accordance with the present invention, the dynamic range of an optical receiver is enhanced through the use of a variable impedance shunt disposed at the input of the receiver. The receiver input comprises a photodetector which is serially connected to a transimpedance amplifier. The photodetector converts the incoming optical signal having a variable optical power level and a modulation bandwidth into a corresponding electrical current. The transimpedance amplifier supplies a fixed amount of gain along with a current to voltage conversion. A gain control circuit, coupled to the output of the transimpedance amplifier, generates a control signal which varies with the output voltage of the transimpedance amplifier. This control signal is applied to the variable impedance shunt to vary the impedance therein to maintain the output voltage of the transimpedance amplifier at a constant amplitude over the modulation bandwidth.

A feature of the present invention is that the enhancement of dynamic range is achieved without significant reduction in sensitivity.

A further feature of the present invention is its applicability to any optical transmission regardless of optical wavelength generated.

DETAILED DESCRIPTION

Figure 1:
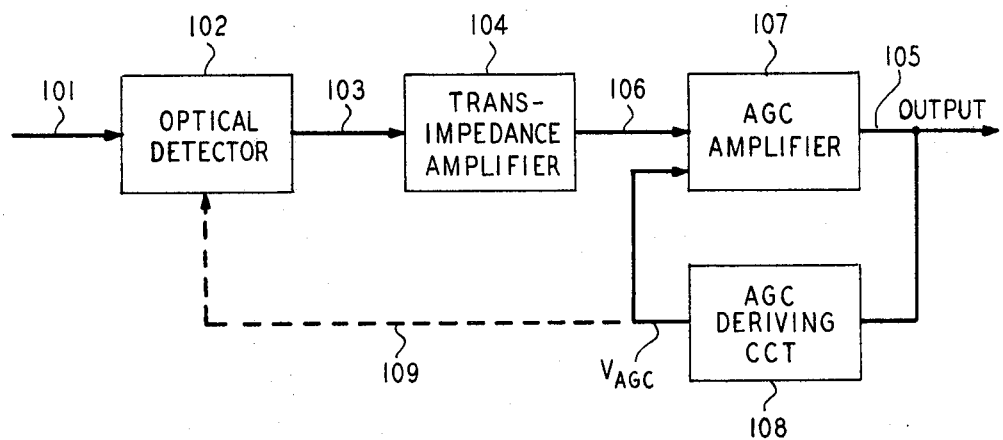
FIG. 1 is a block diagram of a prior art optical receiver.

In an exemplary prior art optical receiver, as shown in FIG. 1, an optical signal on input optical transmission path 101 impinges on optical detector 102. The optical signal has a wavelength that is determined by the optical source. To convey large amounts of information per unit time, the optical signal is modulated at a high rate and has a correspondingly wide modulation bandwidth. In optical transmission systems, especially telecommunication systems, the optical receiver must be capable of providing an electrical signal at a predetermined amplitude over the modulation bandwidth. In typical systems, the modulation bandwidth has a range of magnitudes between 50 and 100 MHz.

The electrical signal generated by detector 102 is coupled via lead 103 to transimpedance amplifier 104. A high signal-to-noise ratio at the receiver output 105 is assured by providing transimpedance amplifier 104 with a fixed high gain. A transimpedance amplifier is typically employed in optical receivers because of modulation bandwidth and sensitivity requirements. A complete discussion of the advantages of transimpedance amplifiers in optical communications systems is discussed in publication entitled "A Feedback Receive Amplifier for Optical Transmission Systems" by J. L. Hullett and T. V. Muoi, IEEE Transactions on Communications, COM-24, No. 10, October 1976, pages 1180-1185.

To maintain the receiver output signal at a predetermined amplitude, the output of transimpedance amplifier 104 is coupled by lead 106 to automatic gain control (AGC) amplifier 107. The gain of AGC amplifier 107 is regulated by control signal $V_{AGC}$ produced by AGC deriving circuit 108. Circuit 108 is disposed in a feedback loop about AGC amplifier 107.

In telecommunications systems, the power level of the optical input signal varies with the length of the optical transmission path between regenerators. The magnitude of this power level variation can be as much as 50dB higher than the minimum system level. This 50dB variation is greater than the dynamic range of the optical receiver. Consequently, high optical power levels generate electrical signals which exceed the maximum input signal level to AGC amplifier 107. When this occurs, a distorted receiver output signal is produced. To reduce the signal input level to amplifier 104, a second AGC, shown by dotted line 109, has been utilized to adjust the gain of an avalanche photodiode used as detector 102. Avalanche photodiodes, however, generate considerable noise in response to "long" wavelength optical signals and are, therefore, not suitable for use in such systems. While PIN diodes are suitable for "long" wavelength detection, they have only unity gain. Therefore, the use of an AGC loop around the optical detector is not applicable in "long" wavelength optical transmission systems.

Prior attempts to increase dynamic range by providing AGC capability to transimpedance amplifier 104 have failed to provide a receiver output signal with the necessary modulation bandwidth and amplitude requirements without degrading receiver sensitivity.

Figure 2:
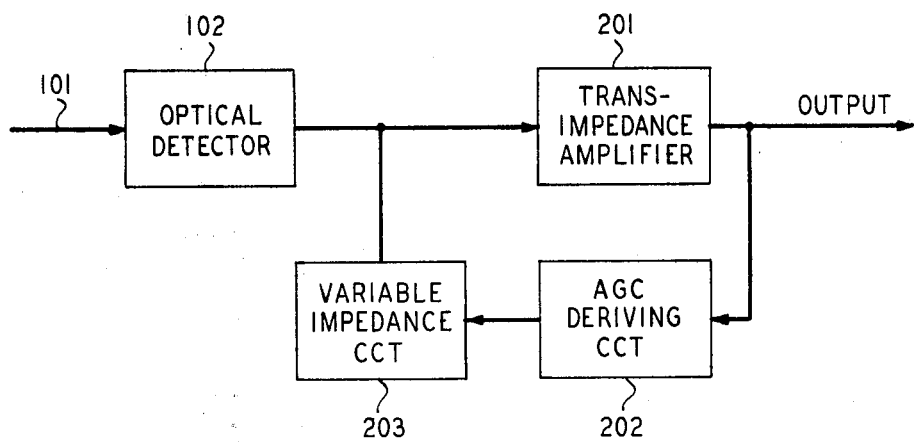
FIG. 2 is a block diagram of an optical receiver in accordance with the present invention.

FIG. 2 shows an optical receiver which has enhanced dynamic range without any loss of receiver sensitivity. This improvement results from the use of an AGC deriving circuit 202 and variable impedance circuit 203 disposed in a feedback loop about a modified transimpedance amplifier 201.

Figure 3:
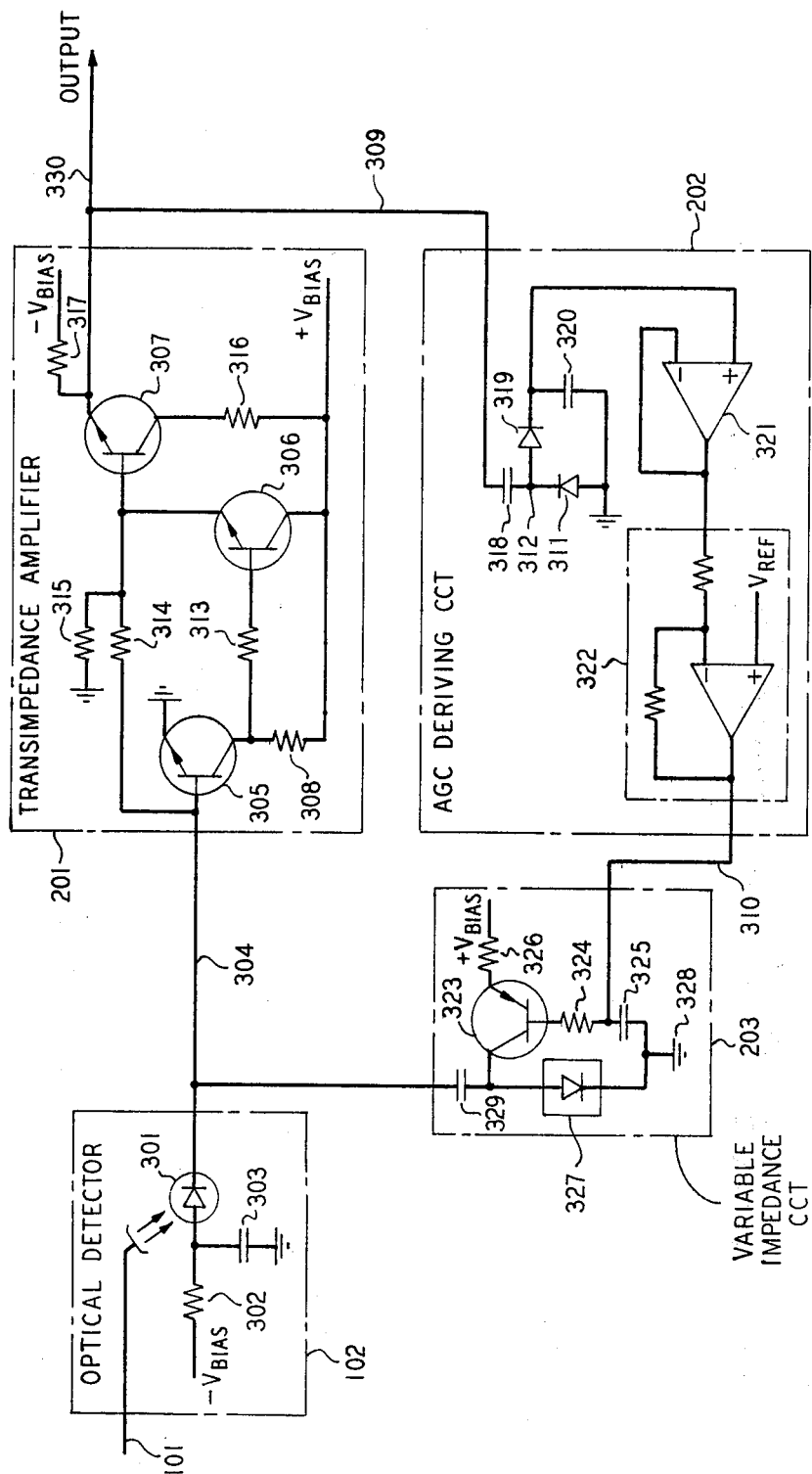
FIG. 3 is a detailed schematic of the optical receiver shown in FIG. 2.

Refer now to FIG. 3. Electrooptic device 301 such as a PIN diode or avalanche photodiode is disposed within optical detector 102 to detect an optical signal on input optical path 101. Device 301 is powered by supply voltage $-V_{BIAS}$ which is filtered by resistor 302 and capacitor 303. Lead 304 connects the photoelectric current generated by device 301 to the input of transimpedance amplifier 201.

Transimpedance amplifier 201, comprising transistors 305, 306 and 307, provides a fixed gain and converts the photodetector current to a voltage on output lead 330. The value of resistor 314 determines the fixed gain of transimpedance amplifier 201 and, accordingly, the amplitude and bandwidth of the receiver output signal. Resistors 303, 313, 315, 316 and 317, on the other hand, are normally selected to provide the desired fixed gain in the open loop condition and do not have a direct effect on the amplitude and bandwidth of the receiver output signal. The criteria for selecting resistor values in the topology shown is well known. As will be discussed, however, a preselected value of resistor 308 is chosen, pursuant to the present invention, to maintain the amplitude of the optical receiver output signal constant over the modulation bandwidth for the range of input optical power levels.

To maintain the amplitude of the output voltage substantially constant, lead 309 couples the output voltage to a negative feedback loop comprising AGC deriving circuit 202 and variable impedance circuit 203. AGC deriving circuit 202, comprising, a clamp and peak detector circuit, buffer amplifier and difference amplifier, generates a control signal $V_{AGC}$ on lead 310 from the receiver output voltage which regulates variable impedance circuit 203. Diode 311 clamps node 312 at the minimum output receiver voltage peak. This voltage is stored on capacitor 318. Diode 319 conducts receiver output voltage swings above the minimum peak. Accordingly, capacitor 320 is charged to the peak-to-peak value of the receiver output voltage. This peak-to-peak value is supplied to buffer amplifier 321 and thence to difference amplifier 322. The output of difference amplifier 322, $V_{AGC}$, is the difference between the peak-to-peak value of the receiver output voltage and a reference voltage, the latter being selected to maintain the receiver output voltage on lead 330 at the desired amplitude.

Control signal $V_{AGC}$ is supplied to the base of transistor 323, through resistor 324, after being filtered by capacitor 325. The bias current of transistor 323 is established by resistor 326 and control signal $V_{AGC}$. Transistor 323 serves as a current source for a variable impedance device 327. Capacitor 329 prevents d.c. coupling between transistor 323 and lead 304. The variable impedance device is preferably a Schottky diode. It should be noted that the variable impedance device 327 forms a shunt between the input to transimpedance amplifier 201 and a reference potential 328, such as ground. Since a transimpedance amplifier has a virtual ground input, the use of a variable impedance device shunting the input will not cause any distortion in the receiver output signal. The forward resistance of a Schottky diode is ideally suited for providing a variable impedance since it can be configured to be unbiased and thereby effectively removed from the circuit for minimum optical input signals.

As the power level of the optical input signal increases, an output voltage will be produced which exceeds the preselected reference voltage $V_{REF}$. In the preferred embodiment, transistor 323 will then turn on causing the Schottky diode to conduct. At high optical power levels the impedance of the Schottky diode becomes less than that of the transimpedance amplifier to effectively shunt a portion of the electrical signal on lead 304. Under this condition, transimpedance amplifier 201 behaves as a voltage amplifier. Consequently, in contrast to the case of low optical signal levels, resistor 308 now has a direct effect on the gain and frequency response of the optical receiver. This effect can be precluded by setting the frequency response of the transimpedance amplifier when behaving as a voltage amplifier to be equal to the frequency response of the closed loop transimpedance amplifier. In the specifically illustrated transimpedance amplifier, this is accomplished by selecting the value of the collector resistor within the first amplification stage, i.e., resistor 308, to provide a frequency response of the first amplification stage equal to the closed loop frequency response of the transimpedance amplifier.

Tests on the above described optical receiver have consistently demonstrated a tenfold increase in dynamic range over prior art receivers. This increase has been achieved without degrading receiver sensitivity. It should also be noted that since the present invention does not require any gain control of the optical detector it can be utilized regardless of the type of optical detector employed. It should, furthermore, be obvious to those skilled in the art that the present invention is applicable to both digital and analog optical transmission systems.

I claim:

1. An optical receiver circuit for an incoming optical signal having a variable power level and a modulation bandwidth, said circuit comprising an optical detector for receiving said optical signal and generating a current therefrom on a substantially resistance-free path, said current varying with the optical signal power level, a transimpedance amplifier having an input impedance and an input terminal continuously at virtual ground which is connected to said path, said amplifier transforming said current to an output voltage, means for generating a control signal which varies in response to said amplifier output voltage, second means connected between said input terminal and a reference potential for maintaining said amplifier output voltge at a predetermined amplitude over said modulation bandwidth by producing an impedance which varies in response to said control signal, the impedance of said second means being substantially greater than that of said amplifier when said amplifier output voltage is less than a preselected threshold so that said second means is effectively removed from said receiver circuit, said second means shunting a portion of said current away from said amplifier when said amplifier output voltage is greater than said threshold.

2. The optical receiver circuit of claim 1 wherein said transimpedance amplifier maintains the same frequency response irrespective of the magnitude of the impedance of the variable impedance device.

3. The optical receiver circuit of claim 2 wherein said photodetector is a PIN diode.

4. The optical receiver circuit of claim 1 wherein said photodetector is an avalanche photodiode.

5. The optical receiver circuit of claim 3 wherein said second means comprises a Schottky diode.

6. The optical receiver circuit of claim 4 wherein said second means comprises a Schottky diode.

* * * * *